United States Patent
Pincu et al.

(10) Patent No.: US 10,204,895 B2
(45) Date of Patent: *Feb. 12, 2019

(54) INTEGRATED CIRCUIT HAVING SPARE CIRCUIT CELLS

(71) Applicant: Marvell World Trade Ltd., St. Michael (BB)

(72) Inventors: Carol Pincu, Rishon Leziyon (IL); Rami Rozenzvaig, Kiriat Motzkin (IL)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 15/444,705

(22) Filed: Feb. 28, 2017

(65) Prior Publication Data
US 2017/0170162 A1   Jun. 15, 2017

Related U.S. Application Data

(63) Continuation of application No. 14/974,367, filed on Dec. 18, 2015, now Pat. No. 9,601,477.

(60) Provisional application No. 62/093,943, filed on Dec. 18, 2014.

(51) Int. Cl.
| | |
|---|---|
| *G06F 17/50* | (2006.01) |
| *H01L 27/02* | (2006.01) |
| *H01L 23/528* | (2006.01) |
| *H01L 21/8234* | (2006.01) |
| *H01L 27/118* | (2006.01) |
| *H01L 23/522* | (2006.01) |
| *H03K 19/177* | (2006.01) |

(52) U.S. Cl.
CPC .. *H01L 27/0207* (2013.01); *H01L 21/823475* (2013.01); *H01L 23/5226* (2013.01); *H01L 23/5286* (2013.01); *H01L 27/11807* (2013.01); *H03K 19/17784* (2013.01); *H01L 2027/11835* (2013.01); *H01L 2027/11881* (2013.01); *H01L 2924/0002* (2013.01); *H03K 19/17764* (2013.01)

(58) Field of Classification Search
USPC .............................................. 716/110, 116
See application file for complete search history.

(56) References Cited

U.S. PATENT DOCUMENTS

| | | | |
|---|---|---|---|
| 6,321,371 B1* | 11/2001 | Yount, Jr. | ........... G06F 17/5068 716/112 |
| 9,230,960 B1* | 1/2016 | Greiner | ................. H01L 27/088 |
| 2002/0000873 A1 | 1/2002 | Tanizaki | |

(Continued)

*Primary Examiner* — Brian Ngo

(57) ABSTRACT

Aspects of the disclosure include an integrated circuit that includes a plurality of functional circuit cells and a plurality of inactive spare functional circuit cells. Ones of the functional circuit cells respectively includes a set of first electrically interconnected transistors that define a first logic component and a first power rail configured to carry a first supply voltage. Ones of the inactive spare functional circuit cells respectively includes a set of second electrically interconnected transistors configured to define a second logic component. The set of electrically interconnected transistors is interconnected through a second set of conductive lines formed in the first conductive layer. The set of second electrically interconnected transistors is not connected to any power rail.

20 Claims, 10 Drawing Sheets

(56) References Cited

U.S. PATENT DOCUMENTS

2014/0002188 A1* 1/2014 Chen ..................... H03F 3/19
330/250

* cited by examiner

INTEGRATED CIRCUIT HAVING SPARE CIRCUIT CELLS

INCORPORATION BY REFERENCE

This present disclosure is a continuation of and claims the benefit of U.S. Ser. No. 14/974,367, filed Dec. 18, 2015, which claims the benefit of U.S. Provisional Application No. 62/093,943, "Integrated Circuit with No Leakage Spare Cells" filed on Dec. 18, 2014; both of which are incorporated herein by reference in their entirety.

FIELD

This disclosure relates generally to an integrated circuit having spare circuit cells. More specifically, the disclosure relates to the configurations of a conductive structure and a power rail of an integrated circuit for a spare circuit cell when the spare circuit cell is in an active mode or in an inactive mode.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

An integrated circuit is fabricated by performing multiple formation and removal processes based on a set of masks. The set of masks are prepared based on a layout design of the integrated circuit, which includes layers of layout patterns illustrating the sizes and shapes of various features of the integrated circuit. The layout design can include a plurality of layout layers for forming electrical components and a plurality of layout layers for forming an interconnection structure electrically connecting the electrical components. In some applications, the layout design is generated by executing a placement-and-routing program based on a circuit schematic of the integrated circuit. In addition to the layout patterns for forming the circuit components as indicated in the circuit schematic, in some applications, layout for forming spare circuit cells are also added to the layout design of the integrated circuit. A spare circuit cell (or also simplified as a "spare cell" in this disclosure) is a circuit cell that does not correspond to any portion of an initial circuit schematic. However, one or more spare cells can be modified or electrically connected with other electrically components when the circuit schematic is modified in order to fix a design flaw or to add or to improve a function of the integrated circuit based on an engineering change order. Although the circuit schematic can be changed to activate spare cells in a modified design, conventionally such modification necessitates the redesign of one or more relatively expensive masks.

SUMMARY

Aspects of the disclosure provide an integrated circuit that includes a plurality of functional circuit cells and a plurality of inactive spare functional circuit cells. Ones of the functional circuit cells respectively includes a set of first electrically interconnected transistors that define a first logic component and a first power rail configured to carry a first supply voltage. The set of first electrically interconnected transistors is interconnected through a first set of conductive lines formed in a first conductive layer of the integrated circuit. The set of first electrically interconnected transistors is electrically coupled to the first power rail through an electrical interconnection formed in a second conductive layer of the integrated circuit. Ones of the inactive spare functional circuit cells respectively includes a set of second electrically interconnected transistors configured to define a second logic component and a second power rail configured to carry the first supply voltage. The set of electrically interconnected transistors is interconnected through a second set of conductive lines formed in the first conductive layer. The set of second electrically interconnected transistors is electrically disconnected from the second power rail.

In an embodiment, the second power rail is disposed in the first conductive layer. At least one of the inactive spare functional circuit cells includes a first conductive line in the second conductive layer and electrically coupled with the second power rail and a second conductive line in the second conductive layer and electrically coupled with the corresponding set of second electrically interconnected transistors. The first conductive line and the second conductive line are aligned but separated from each other.

In an embodiment, the second power rail is disposed in the first conductive layer. At least one of the inactive spare functional circuit cells includes a conductive line in the second conductive layer electrically coupled with the corresponding set of second electrically interconnected transistors. A portion of the conductive line overlaps but electrically disconnected from the second power rail.

Aspects of the disclosure provide an integrated circuit. The integrated circuit includes an interconnection structure and a plurality of transistors under the interconnection structure. The interconnection structure includes a first power rail configured to carry a first supply voltage, a second power rail configured to carry a second supply voltage different from the first supply voltage, and a conductive structure. The plurality of transistors is electrically interconnected between a first power node and a second power node of a spare circuit cell, and the second power node is electrically coupled with the second power rail. When the spare circuit cell is in an active mode, the conductive structure electrically couples the first power node and the first power rail. When the spare circuit cell is in an inactive mode, the conductive structure does not electrically couple the first power node and the first power rail.

Aspects of the disclosure provide a method of manufacturing an integrated circuit. The method includes forming a plurality of transistors and forming an interconnection structure. Forming the interconnection structure includes forming a first power rail configured to carry a first supply voltage, forming a second power rail configured to carry a second supply voltage different from the first supply voltage, and forming a conductive structure. The plurality of transistors are electrically interconnected between a first power node and a second power node of a spare circuit cell, and the second power node being electrically coupled with the second power rail. When the spare circuit cell is in an active mode, the conductive structure electrically couples the first power node and the first power rail. When the spare circuit cell is in an inactive mode, the conductive structure does not electrically couple the first power node and the first power rail.

In an embodiment, the method further includes forming the first power rail comprises forming the first power rail in a first conductive layer. Forming the conductive structure includes forming a first conductive line in a second conductive layer, forming a first via electrically coupling the first conductive line and the first power rail, forming a second conductive line in the second conductive layer, and forming a second via electrically coupling the second conductive line and the first power node. When the spare circuit cell is in the active mode, forming the conductive structure further includes forming a third conductive line, the third conductive line physically connecting the first conductive line and the second conductive line. When the spare circuit cell is in the inactive mode, forming the conductive structure does not include forming the third conductive line, and the first conductive line and the second conductive line are separated from each other.

In an embodiment, the method further includes forming the first power rail comprises forming the first power rail in a first conductive layer. Forming the conductive structure includes forming a conductive line in a second conductive layer. The conductive line has a first portion and a second portion, with the second portion overlapping the first power rail. Forming the conductive structure further includes forming a first via that electrically couples the first portion of the conductive line and the first power node. When the spare circuit cell is in the active mode, forming the conductive structure further includes forming a second via that electrically couples the second portion of the conductive line and the first power rail. When the spare circuit cell is in the inactive mode, forming the conductive structure does not include forming the second via.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

An integrated circuit according to the present application may include one or more functional circuit cells, one or more active spare functional circuit cells, and/or one or more inactive spare functional circuit cells.

Figure 1A:
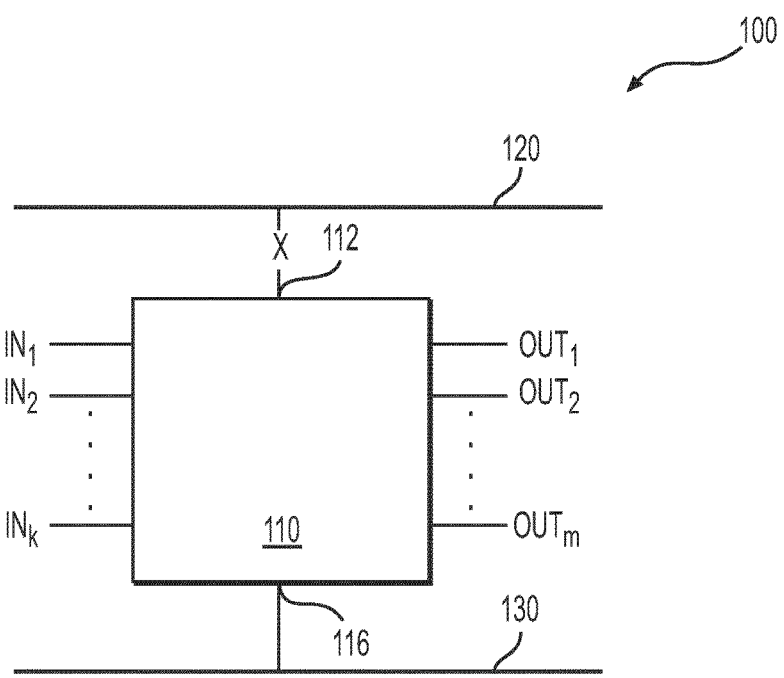
FIG. 1A shows a functional block diagram of a spare cell example 100 when the spare cell is in an inactive mode according to an embodiment of the disclosure.

FIG. 1A shows a functional block diagram of a spare cell example 100 when the spare cell is in an inactive mode according to an embodiment of the disclosure. Spare cell 100 includes a logic component 110, a first power rail 120 configured to carry a first supply voltage, and a second power rail 130 configured to carry a second supply voltage different from the first supply voltage. In some embodiments, the first supply voltage is a positive supply voltage (sometimes also called the "VDD supply voltage") of an integrated circuit where the spare cell 100 resides. In some embodiments, the second supply voltage is a negative supply voltage (sometimes also called the "VSS supply voltage") or a ground reference voltage (sometimes also called the "GND voltage") of the integrated circuit.

The logic component 110 includes a first power node 112, a second power node 116, one or more input terminals $IN_1$~$N_k$, and one or more output terminals $OUT_1$~$OUT_m$. The logic component 110 includes a plurality of transistors (not seen) electrically interconnected between the first power node 112 and the second power node 116. Input signals for the logic component 110 are received through the one or more input terminals $IN_1$~$IN_k$, and output signals from the logic component 110 are output through the one or more output terminals $OUT_1$~$OUT_m$.

The logic component 110 includes a buffer, delay, or a logic gate such as a NAND, NOR, AND, OR, XOR, INV, AOI, or OAI, or other types of logic gates, for example. In at least one example, the logic component 110 is configurable to function as two or more different types of logic gates based on one or more control signals received from the input terminals $IN_1$~$IN_k$. In at least one example, the logic component 110 is configurable to function as two or more different types of logic gates by changing the electrically interconnection among the plurality of transistors of the logic component 110. In some embodiments, the logic components 110 for various active or inactive spare cells in an integrated circuit correspond to the same logic functionality. In some embodiments, the logic components 110 for various active or inactive spare cells in the integrated circuit correspond to different logic functionalities.

The logic component 110 is powered by supply voltages provided on the first power node 112 and the second power node 116. When the spare cell 100 is in an active mode (not shown), the first power node 112 is electrically coupled with the first power rail 120 to receive the first supply voltage therefrom, and the second power node 116 is electrically coupled with the second power rail 130 to receive the second supply voltage therefrom. When the spare cell 100 is in an inactive mode (as depicted in FIG. 1), the first power node 112 is not electrically coupled with the first power rail 120 while the second power node 116 is electrically coupled with the second power rail 130 to receive the second supply voltage. Accordingly, a leakage path from the first power rail 120 through drain-source paths of various transistors of the logic gate 110 to the second power rail 130 is electrically disconnected.

In some embodiments, an active spare cell had been provided as an inactive spare cell in a previous version of the integrated circuit. In at least one embodiment, the inactive spare cell in the previous version of the integrated circuit is modified to be electrically coupled with the corresponding first power rail in response to an engineering change order.

In some embodiments, when the spare cell 100 is in the inactive mode, at least one gate terminal of the plurality of transistors of the logic component 110 is electrically coupled with the second power rail 130. Accordingly, a leakage path from the gate terminal through a source or drain terminal of the corresponding transistor to the second power rail 130 is bypassed by shorting the gate terminal and the second power rail 130.

Electrically coupling the second power node 116 and the second power rail 130 by electrically isolating the first power node 112 and the first power rail 120 when the spare cell 100 is in the inactive mode are illustrated as an example in this disclosure. In at least another example, when the spare cell 100 is in the inactive mode, the first power node 112 and the first power rail 120 are electrically coupled, and the second power node 116 and the second power rail 130 are electrically disconnected or otherwise electrically isolated.

Figure 1B:
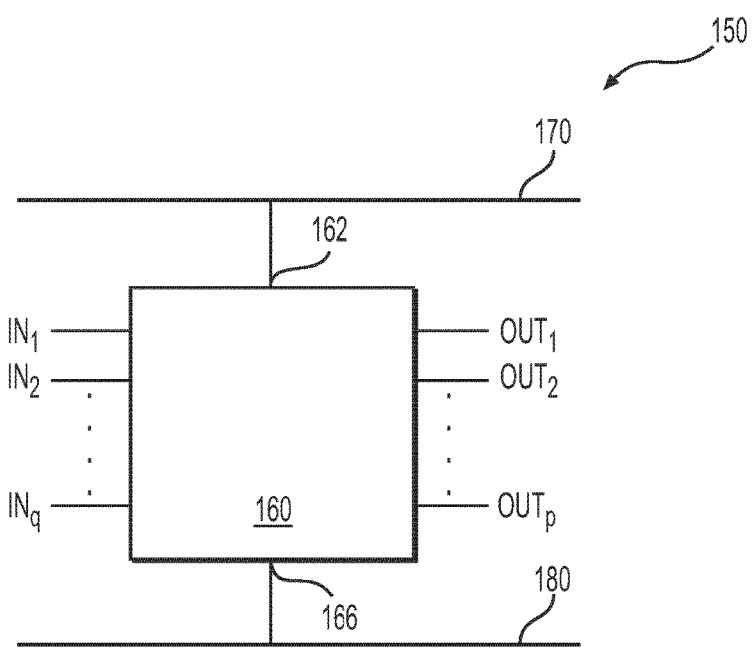
FIG. 1B shows a functional block diagram of a functional circuit cell example 150 according to an embodiment of the disclosure.

FIG. 1B shows a functional block diagram of a functional circuit cell example 150 according to an embodiment of the disclosure.

Functional circuit cell 150 includes a logic component 160, a first power rail 170 configured to carry the first supply voltage, and a second power rail 180 configured to carry a second supply voltage different from the first supply voltage. The logic component 160 includes a first power node 162, a second power node 166, one or more input terminals $IN_1$~$IN_q$, and one or more output terminals $OUT_1$~$OUT_p$. The logic component 160, the first power rail 170, and the second power rail 180 correspond to the logic component 110, the first power rail 120, and the second power rail 130 in FIG. 1A, and the detailed description thereof is thus omitted.

The logic component 160 includes a buffer, delay, or a logic gate such as a NAND, NOR, AND, OR, XOR, INV, AOI, or OAI, or other types of logic gates, for example. In some embodiments, some of the logic component 110 for various active or inactive spare cells and some of the logic components 160 for various functional circuit cells in an integrated circuit correspond to the same logic functionality. In some embodiments, some of the logic component 110 for various active or inactive spare cells and some of the logic components 160 for various functional circuit cells in the integrated circuit correspond to different logic functionalities.

Figure 2:
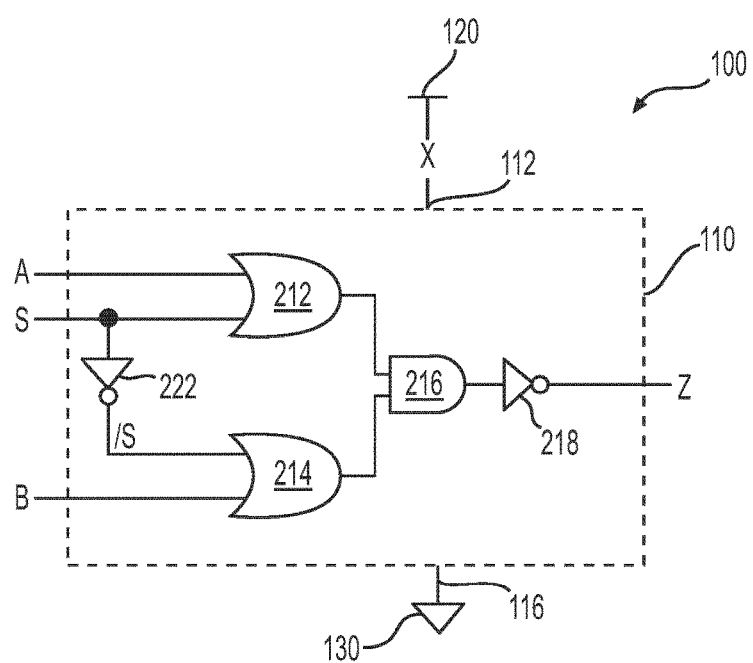
FIG. 2 shows a circuit schematic diagram of a spare cell example 100 when the spare cell is in an inactive mode according to an embodiment of the disclosure.

FIG. 2 shows a circuit schematic diagram of the spare cell example 100 when the spare cell is in an inactive mode according to an embodiment of the disclosure. Components in FIG. 2 that are the same or similar to those in FIG. 1 are given the same reference numbers, and detailed description thereof is thus omitted. In this example, the logic component 110 of the spare cell 100 includes an OAI (OR-AND-INVERTER) gate. In other embodiments, the logic component 110 can include other types of suitable logic gates.

The logic component 110 includes three input terminals A, B, and S (e.g., $IN_1$~$IN_3$ in FIG. 1) and an output terminal Z (e.g., $OUT_1$ in FIG. 1), in an embodiment. The logic component 110 includes two OR gates 212 and 214, an AND gate 216, and two inverters 218 and 222. A first input terminal of the OR gate 212 is electrically coupled with the input terminal A. A second input terminal of the OR gate 212 is electrically coupled with the input terminal S. A first input terminal of the OR gate 214 is electrically coupled with the input terminal B. An input terminal of the inverter 222 is electrically coupled with the input terminal S. The output terminal (labeled as "/S") of the inverter 222 is electrically coupled with a second input terminal of the OR gate 214.

An output terminal of the OR gate 212 is electrically coupled with a first input terminal of the AND gate 216. An output terminal of the OR gate 214 is electrically coupled with a second input terminal of the AND gate 216. An output terminal of the AND gate 216 is electrically coupled with an input terminal of the inverter 218. An output terminal of the inverter 218 is electrically coupled with the output terminal Z of the logic component 110.

Figure 3:
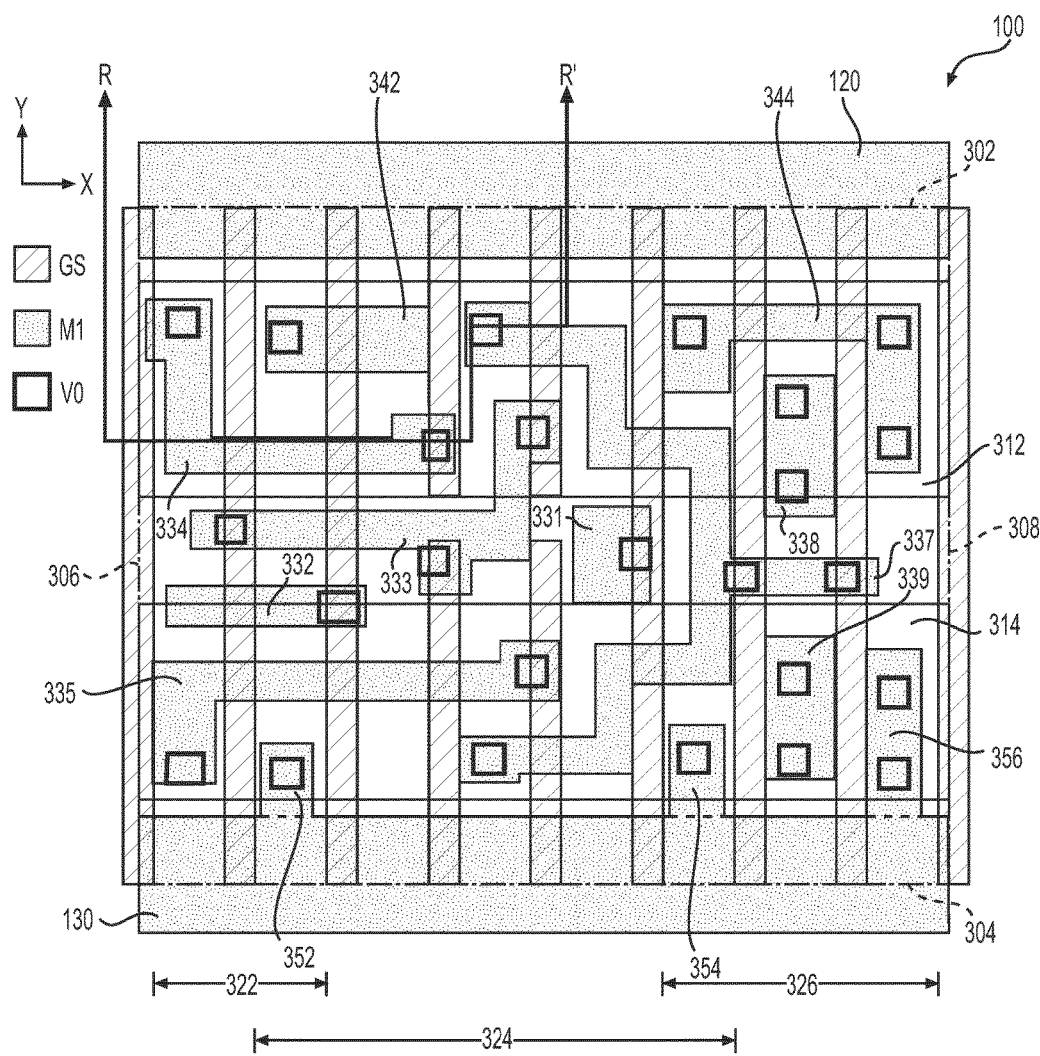
FIG. 3 shows a top view of the spare cell example 100 of FIG. 2, depicting the features thereof up to a first conductive layer, according to an embodiment of the disclosure.

FIG. 3 shows a top view of the spare cell example 100 of FIG. 2, depicting the features of the spare cell 100 up to a first conductive layer M1, according to an embodiment of the disclosure. FIG. 3 is depicted in a layout diagram style, and not every feature of the spare cell 100 is seen in FIG. 3. The components in FIG. 3 that are the same or similar to those in FIG. 2 are given the same reference numbers, and detailed description thereof is thus omitted.

Reference lines 302, 304, 306, and 308 indicate the cell boundaries of the spare cell 100. Reference lines 302 and 304 extend along a first direction X, and reference lines 306 and 308 extend along a second direction Y different from the first direction.

The spare cell 100 includes the first power rail 120 and the second power rail 130. The first power rail 120 is in the first conductive layer M1 extending along the cell boundary 302. The second power rail 130 is similarly in the first conductive layer M1 extending along the cell boundary 304. The first power rail 120 and the second power rail 130 are not necessarily confined within the cell boundaries 302-308. Rather, in the example seen, the first power rail 120 overlaps the cell boundary 302 and is shared by the spare cell 100 and another circuit cell abutting the spare cell 100 at the cell boundary 302; and the second power rail 130 overlaps the cell boundary 304 and is shared by the spare cell 100 and another circuit cell abutting the spare cell 100 at the cell boundary 304.

The spare cell 100 also includes a first active area 312 and a second active area 314 above a substrate (e.g., 510 in FIG. 5), a plurality of gate electrode structures GS extending along the second direction Y above the active areas 312 and 314, a plurality of conductive lines in the first conductive layer M1 above the active areas 312 and 314 and the gate electrode structures GS, and a plurality of vias in a via-zero layer V0 connecting various conductive lines in the first conductive layer M1 and the active areas 312 and 314 and the gate electrode structures GS. The first active area 312 and corresponding gate electrode structures GS form a plurality of transistors of a first type, such as P-type transistors in FIG. 3. The second active area 314 and corresponding gate electrode structures GS form a plurality of transistors of a second type, such as N-type transistors in FIG. 3. In some embodiments, the first active area 312 and the second active area 314 extend along the first direction X beyond the cell boundaries 306 and 308. In some embodiments, the first active area 312 and the second active area 314 are confined between the cell boundaries 306 and 308.

The plurality of transistors of the first type and the plurality of transistors of the second type formed based on the active areas 312 and 314 and various gate electrode structures GS are electrically interconnected as the logic component 110. Comparing FIG. 3 and FIG. 2, within the cell boundaries 302-308, the transistors formed in area 322 are interconnected as the inverter 222; the transistors formed in area 324 are interconnected as the OR gates 212 and 214 and the AND gate 216; and the transistors formed in area 326 are interconnected as the inverter 218.

The first conductive layer M1 also includes conductive lines 331, 332, 333, 334, 335, 337, 338, 339, 342, 344, 352, 354, and 356. The conductive line 331 corresponds to the input terminal A. The conductive line 332 corresponds to the input terminal B. The conductive line 333 corresponds to the input terminal S. The conductive lines 334 and 335 correspond to the terminal /S. The conductive line 337 corresponds to the input terminal of the inverter 218. The conductive lines 338 and 339 correspond to the output terminal Z.

Furthermore, the conductive lines 342 and 344 correspond to the first power node 112 of the logic component 110; and the conductive lines 352, 354, and 356 correspond to the second power node 116 of the logic component 110. As depicted in FIG. 3, the conductive lines 352, 354, and 356 are integrally formed with the second power rail 130. Therefore, the second power node 116 of the spare cell 100 is electrically coupled with the second power rail 130. On the other hand, the conductive lines 342 and 344 are separated from the first power rail 120.

Figure 4A:
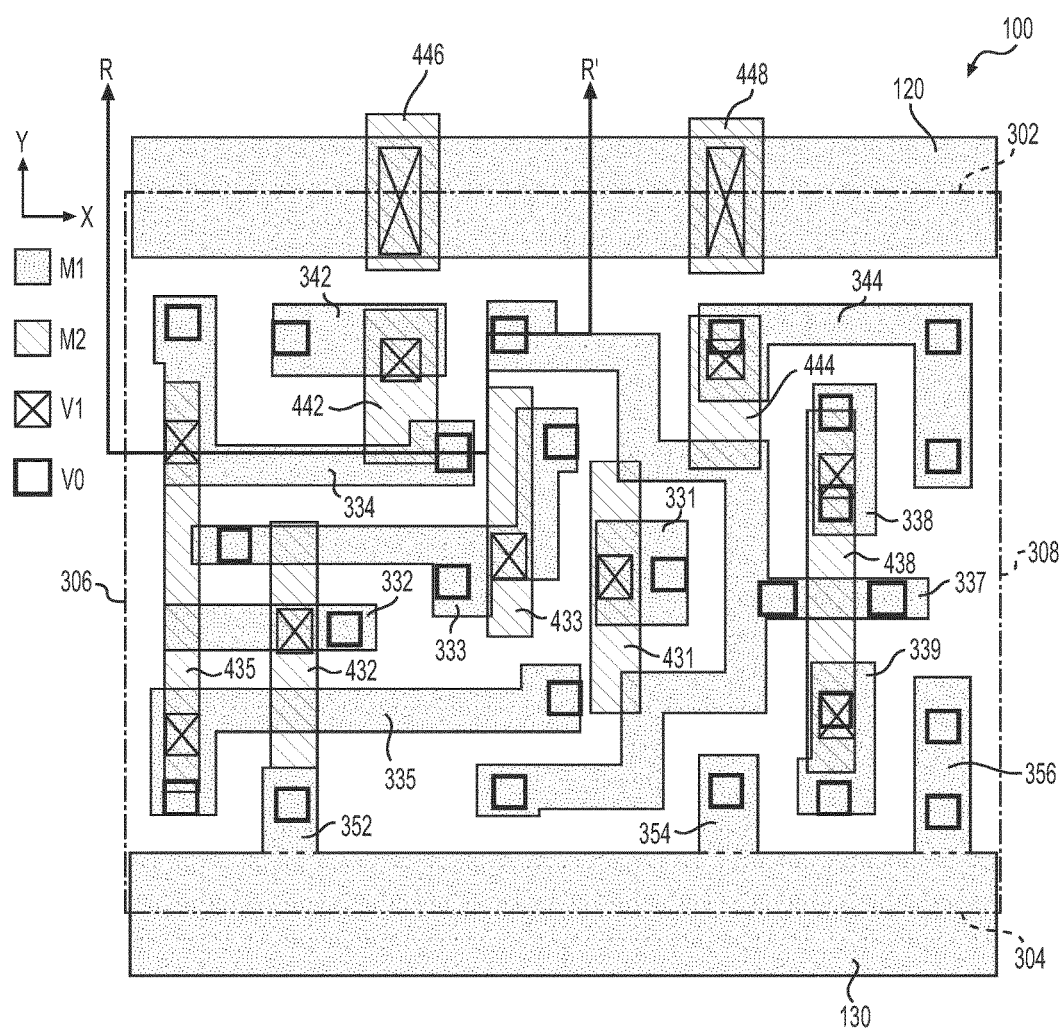
FIG. 4A shows a top view of a spare cell example when the spare cell 100 of FIG. 2 is in an inactive mode, depicting the features thereof from a via-zero layer up to a second conductive layer, according to an embodiment of the disclosure.

FIG. 4A shows a top view of the spare cell example 100 when the spare cell 100 of FIG. 2 is in an inactive mode, depicting the features of the spare cell 100 from a via-zero layer V0 up to a second conductive layer M2, according to an embodiment of the disclosure. FIG. 4A is depicted in a layout diagram style, and not every features of the spare cell 100 is shown in FIG. 4A. The components in FIG. 4A that are the same or similar to those in FIG. 3 are given the same reference numbers, and detailed description thereof is thus omitted.

In addition to the components depicted in FIG. 3, the spare cell 100 further includes a plurality of conductive lines in a second conductive layer M2 above the first conductive layer M1 and a plurality of vias in a via-one layer V1 connecting various conductive lines in the first conductive layer M1 and conductive lines in the second conductive layer M2.

The second conductive layer M2 includes conductive lines 431, 432, 433, 435, 438, 442, 444, 446, and 448. The conductive line 431 is electrically coupled with conductive line 331 through a corresponding via V1 and also corresponds to the input terminal A. The conductive line 432 is electrically coupled with conductive line 332 through a corresponding via V1 and also corresponds to the input terminal B. The conductive line 433 is electrically coupled with conductive line 333 through a corresponding via V1 and also corresponds to the input terminal S. The conductive line 435 is electrically coupled with conductive lines 334 and 335 through corresponding vias V1. The conductive line 438 is electrically coupled with conductive lines 338 and 339 through corresponding vias V1 and also corresponds to the output terminal Z.

Furthermore, the conductive line 442 is electrically coupled with conductive line 342 through a corresponding via V1 and corresponds to the first power node 112; and the conductive line 444 is electrically coupled with conductive line 344 through a corresponding via V1 and also corresponds to the first power node 112. The conductive lines 446 and 448 are electrically coupled with the power rail 120 through corresponding vias V1. The conductive lines 442 and 446 are aligned along the direction Y but are separated from each other. The conductive lines 444 and 448 are aligned along the direction Y but are separated from each other. Accordingly, the first power node 112 of the spare cell 100 is not electrically coupled with the first power rail 120.

Figure 4B:
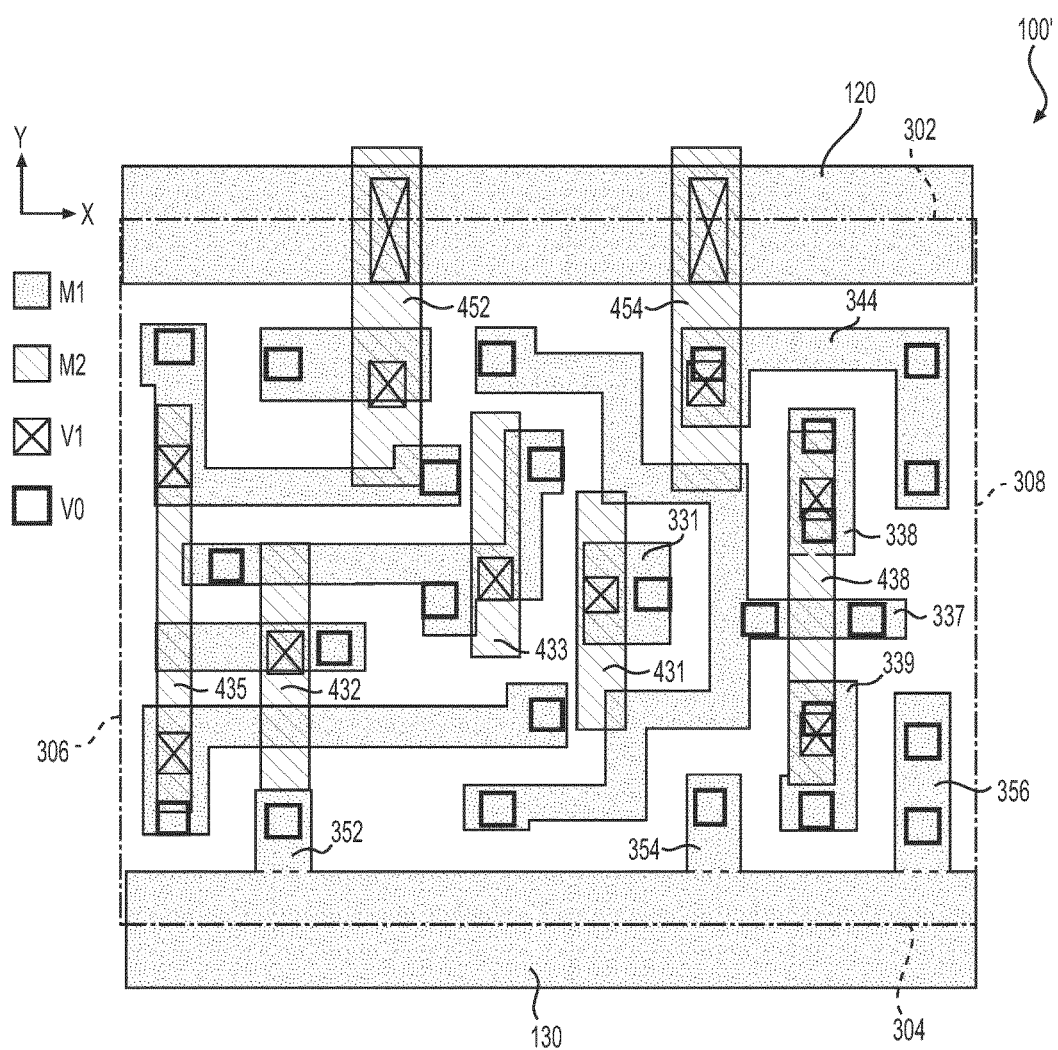
FIG. 4B shows a top view of a spare cell example when the spare cell 100 of FIG. 2 is in an active mode, depicting the features thereof from the via-zero layer up to the second conductive layer, according to an embodiment of the disclosure.

FIG. 4B shows a top view of the spare cell example 100' when the spare cell 100 of FIG. 2 is in an active mode, depicting the features of the spare cell 100' from the via-zero layer V0 up to the second conductive layer M2, according to an embodiment of the disclosure. FIG. 4B is depicted in a layout diagram style, and not every features of the spare cell 100' is shown in FIG. 4B. The components in FIG. 4B that are the same or similar to those in FIG. 3 or FIG. 4A are given the same reference numbers, and detailed description thereof is thus omitted.

Compared with the spare cell 100 in FIG. 4A, the second conductive layer M2 in FIG. 4B replaces conductive lines 442, 444, 446, and 448 with conductive lines 452 and 454. The conductive line 452 is electrically coupled with the conductive line 342 and the first power rail 120 through corresponding vias V1; and the conductive line 454 is electrically coupled with the conductive line 344 and the first power rail 120 through corresponding vias V1. In some embodiments, conductive line 452 occupies the areas corresponding to the conductive lines 442 and 446 can be conceptually considered as formed by inserting another conductive line aligned with the conductive lines 442 and 446 to bridge the gap therebetween. In some embodiments, conductive line 454 occupies the areas corresponding to the conductive lines 444 and 448 can be conceptually considered as formed by inserting another conductive line aligned with the conductive lines 444 and 448 to bridge the gap therebetween. Accordingly, the first power node 112 of the spare cell 100' is electrically coupled with the first power rail 120.

As depicted in FIG. 4A and FIG. 4B, the only difference between spare cell 100 (i.e., when the spare cell 100 is in the inactive mode) and spare cell 100' (i.e., when the spare cell 100 is in the active mode) is the features in the second conductive layer M2. Therefore, when an circuit designer plans to activate the spare cell 100 in order to revise a circuit design of an integrated circuit based on an engineering change order, at the circuit cell level, only the layout patterns corresponding to manufacturing the second conductive layer M2 is changed. The layout patterns corresponding to the active areas or the gate structures remain the same. As such, in this example, only the mask(s) corresponding to manufacturing the second conductive layer M2 is replaced. Compared with the masks for manufacturing the active areas, the gate structures, or even the first conductive layer M1, in some embodiments, the mask(s) corresponding to manufacturing the second conductive layer M2 typically is less expensive. Also, compared with changing the layout patterns of the active areas, the gate structures, or even the first conductive layer M1, in some embodiments, changing the layout patterns of the second conductive layer M2 is less likely to cause a noticeable impact to the yield rate or the performance of the resulting integrated circuit.

Figure 5:
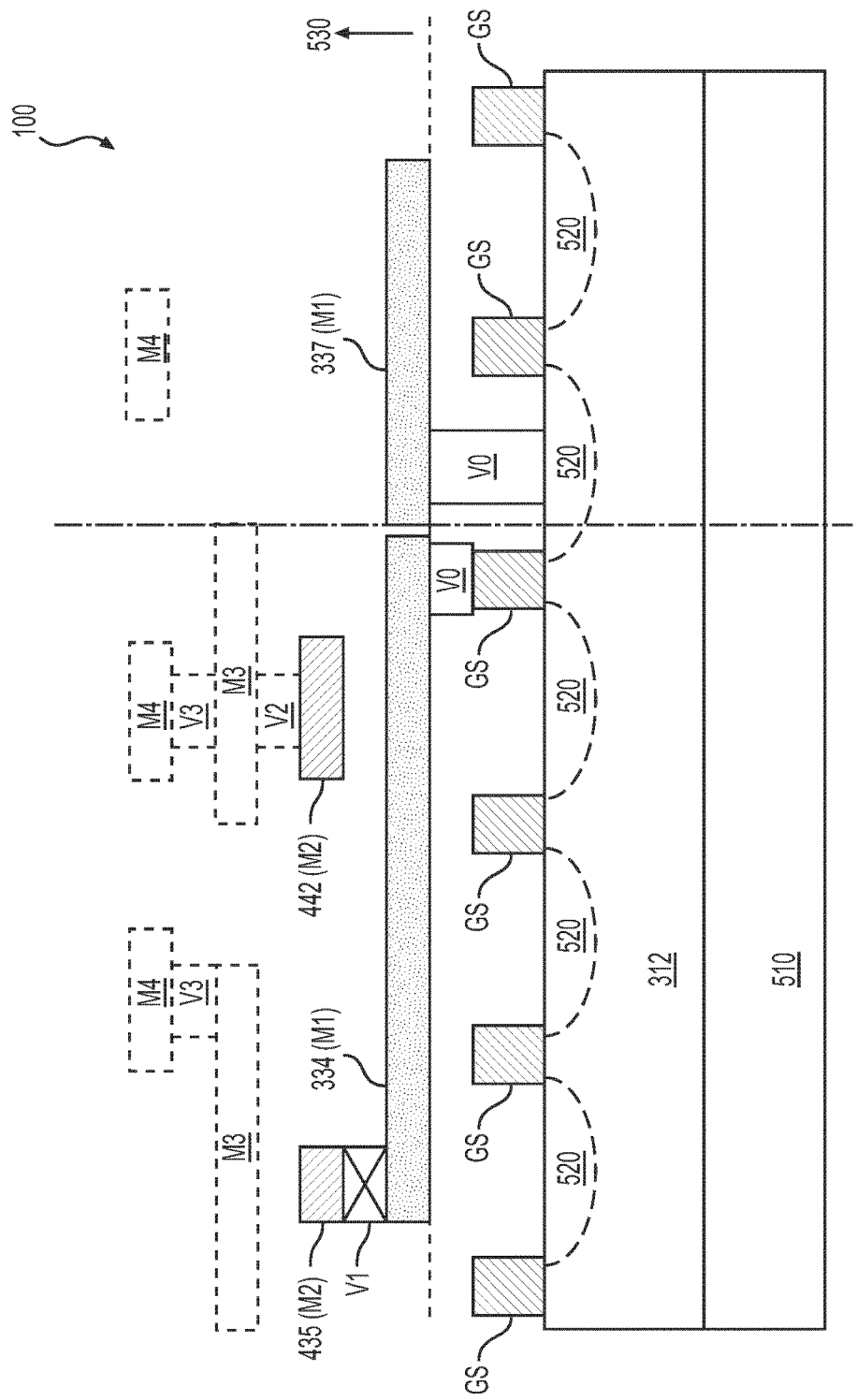
FIG. 5 shows a cross-sectional view of the spare cell 100 of FIG. 2 taken from reference line R-R' in FIGS. 3 and 4A according to an embodiment of the disclosure.

FIG. 5 shows a cross-sectional view of the spare cell 100 FIG. 2 taken from reference line R-R' in FIGS. 3 and 4A according to an embodiment of the disclosure. The components in FIG. 5 that are the same or similar to those in FIG. 3 and FIG. 4A are given the same reference numbers, and detailed description thereof is thus omitted.

The spare cell 100 includes a substrate 510, the active area 312 above the substrate 510, a plurality of gate structures GS above the active area 312, an interconnection structures 530 above the gate structures GS and the active area 312, and a plurality of vias in the via-zero layer V0 connecting a gate structure GS and the active area 312 with the corresponding conductive lines 334 and 337 of the interconnection structures 530.

In some embodiments, the substrate 510 is a semiconductor or alloy substrate including pure or lightly doped silicon, germanium, or gallium arsenide, or other suitable materials. In some embodiments, the substrate 510 has a multi-layer structure including layers of different semiconductor or alloy materials and/or insulation materials. The active area 312 includes an N-doped material for forming P-type transistors in the depicted example. In some embodiments, the active area 312 is grown on the substrate 510. In some embodiments, the active area 312 is formed by performing an implantation process on an upper portion of the substrate 510.

The gate structures GS includes a gate dielectric layer above the active area 312 and one or more layers of conductive materials above the gate dielectric layer. The areas 520 within the active area 312 and between two adjacent gate structures GS become drain or source regions of the resulting transistors. The vias in the via-zero layer V0 connects one of the gate structures GS and one of the drain or source regions 520 to the interconnection structure 530. In some applications, the active area 312 and the gate structures GS are together referred to as a component structure of the integrated circuit. In some applications, the vias in the via-zero layer V0 are considered as part of the component structure. In some other applications, the vias in the via-zero layer V0 are considered as part of the interconnection structure 530.

In some embodiments, the vias in the via-zero layer V0 has a material including aluminum, copper, tungsten, any suitable materials, or an alloy thereof. In some embodiments, the vias in the via-zero layer V0 has a multi-layer structure.

The interconnection structure 530 includes a plurality of layers of conductive lines M1, M2, M3, and M4 and a plurality of layers of vias V1, V2, and V3 stacked one over another. In some embodiments, the interconnection structure 530 includes more or less conductive layers and/or via layers than those depicted in FIG. 5. In this example, only a portion of the interconnection structure 530, including conductive layers M1 and M2 and via layer V1, are considered to be part of the spare cell 100, because those are the conductive structures that are primarily used for interconnecting transistors within a circuit cell. In contrast, the conductive layers and via layers of the interconnection structure 530 over the second conductive layer M2 are primarily used for interconnecting two or more circuit cells.

In some applications, the portion of the interconnection structure 530 that is primarily used for electrically connecting signals among various transistors within a circuit cell is called a local interconnection structure, and the portion of the interconnection structure 530 that is primarily used for electrically connecting signals among different circuit cells is called a global interconnection structure. In some embodiments, the layout patterns corresponding to the local interconnection structure is predetermined as part of a layout design of a circuit cell. In some embodiments, the layout patterns corresponding to the global interconnection structure is predetermined by a routing software program after the layout designs of various circuit cells are selected and placed in an integrated circuit layout area.

In some embodiments, one or more of the vias in the via layers V1, V2, and V3 and the conductive layers M1, M2, M3, and M4 have a material including aluminum, copper, tungsten, any suitable materials, or an alloy thereof. In some embodiments, one or more of the vias in the via layers V1, V2, and V3 and the conductive layers M1, M2, M3, and M4 have a multi-layer structure.

Figure 6A:
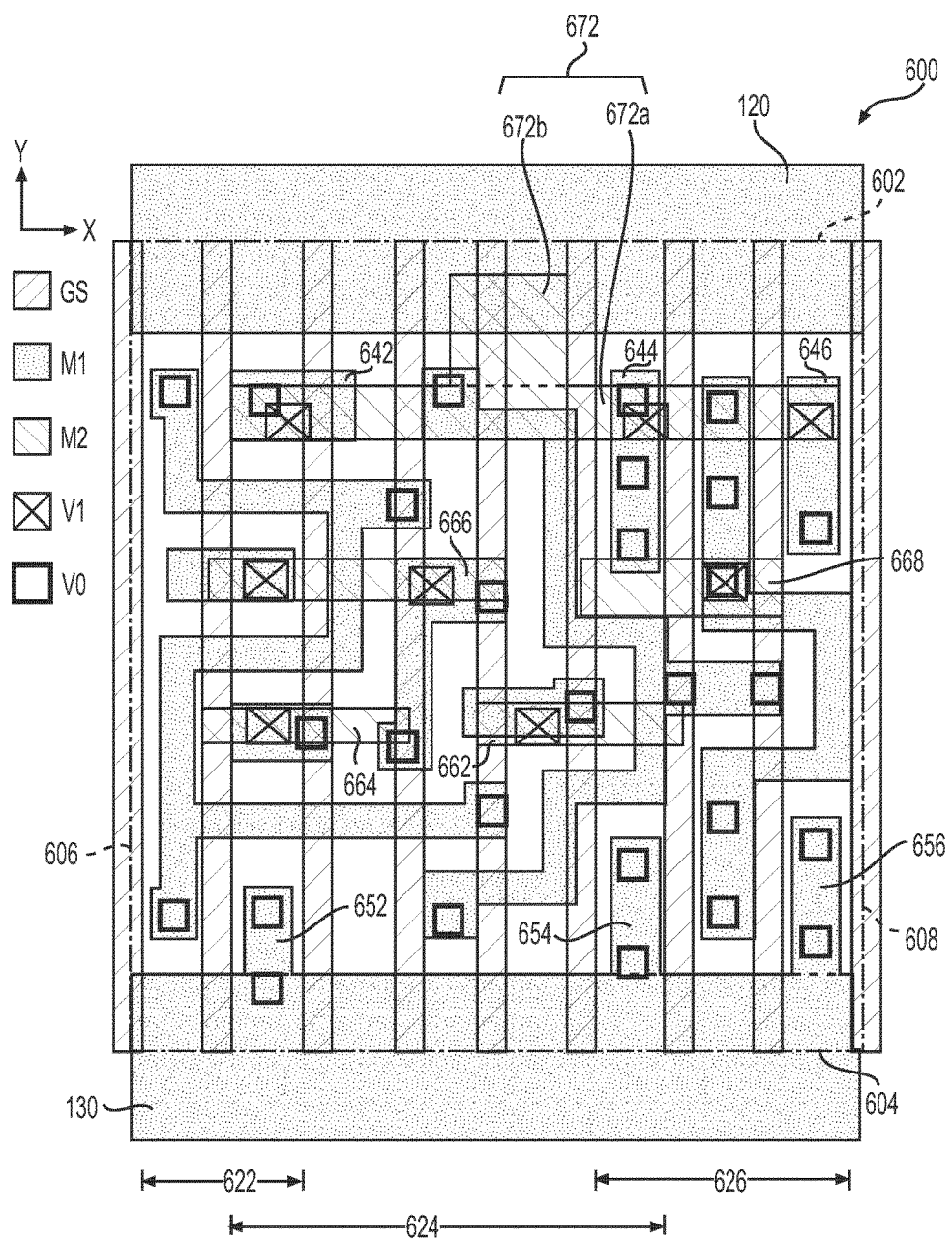
FIG. 6A shows a top view of another spare cell example 600 of the spare cell 100 in FIG. 2 when the spare cell is in an inactive mode, depicting the features thereof from a gate electrode layer and a via-zero layer up to a second conductive layer, according to an embodiment of the disclosure.

FIG. 6A shows a top view of another spare cell example 600 of the spare cell 100 in FIG. 2 when the spare cell is 100 in an inactive mode, depicting the features of spare cell 600 from a gate electrode layer GS and a via-zero layer V0 up to a second conductive layer M2, according to an embodiment of the disclosure. FIG. 6A is depicted in a layout diagram style, and not every features of the spare cell 600 is shown in FIG. 6A. The components in FIG. 6A that are the same or similar to those in FIG. 2 are given the same reference numbers, and detailed description thereof is thus omitted.

Reference lines 602, 604, 606, and 606 indicate the cell boundaries of the spare cell 600. Reference lines 602 and 604 extend along a first direction X, and reference lines 606 and 608 extend along a second direction Y different from the first direction.

The spare cell 600 includes a plurality of gate structures GS extending along the second direction Y, conductive lines in a first conductive layer M1 above the gate structures GS, vias in a via-zero layer V0 connecting various conductive lines in the first conductive layer M1 and the gate electrode structures GS and corresponding active areas (not shown), conductive lines in a second conductive layer M2 above the first conductive layer M1, and vias in a via-one layer V1 connecting various conductive lines in the first conductive layer M1 and various conductive lines in the second conductive layer M2. Comparing FIG. 6A and FIG. 2, within the cell boundaries 602-608, the transistors formed in area 622 are interconnected as the inverter 222; the transistors formed in area 624 are interconnected as the OR gates 212 and 214 and the AND gate 216; and the transistors formed in area 626 are interconnected as the inverter 218.

The first conductive layers M1 includes a first power rail 120, a second power rail 130, conductive lines 642, 644, 646, 652, 654, 656, and other conductive lines not labeled in FIG. 6A. The conductive lines 642, 644, and 646 correspond to the first power node 112 of the logic component 110; and the conductive lines 652, 654, and 656 correspond to the second power node 116 of the logic component 110. As depicted in FIG. 6A, the conductive lines 652, 654, and 656 are integrally formed with the second power rail 130. Accordingly, the second power node 116 of the spare cell 600 is electrically coupled with the second power rail 130. On the other hand, the conductive lines 642, 644, and 646 are separated from the first power rail 120.

The second conductive layer M2 includes conductive lines 662, 664, 666, 668, and 672, and other conductive lines not labeled in FIG. 6A. The conductive line 662 corresponds to the input terminal A. The conductive line 664 corresponds to the input terminal B. The conductive line 666 corresponds to the input terminal S. The conductive line 668 corresponds to the output terminal Z.

Furthermore, the conductive line 672 has a first portion 672a that is electrically coupled with conductive lines 642, 644, and 646 through corresponding vias V1 and corresponds to the first power node 112. The conductive line 672 also has a second portion 672b that overlaps the first power rail 120. However, when the spare cell 600 is in the inactive mode, there is no via in the via-one layer V1 that connects the second portion 672b of the conductive line 672 and the first power rail 120. Accordingly, the first power node 112 of the spare cell 600 is not electrically coupled with the first power rail 120.

Figure 6B:
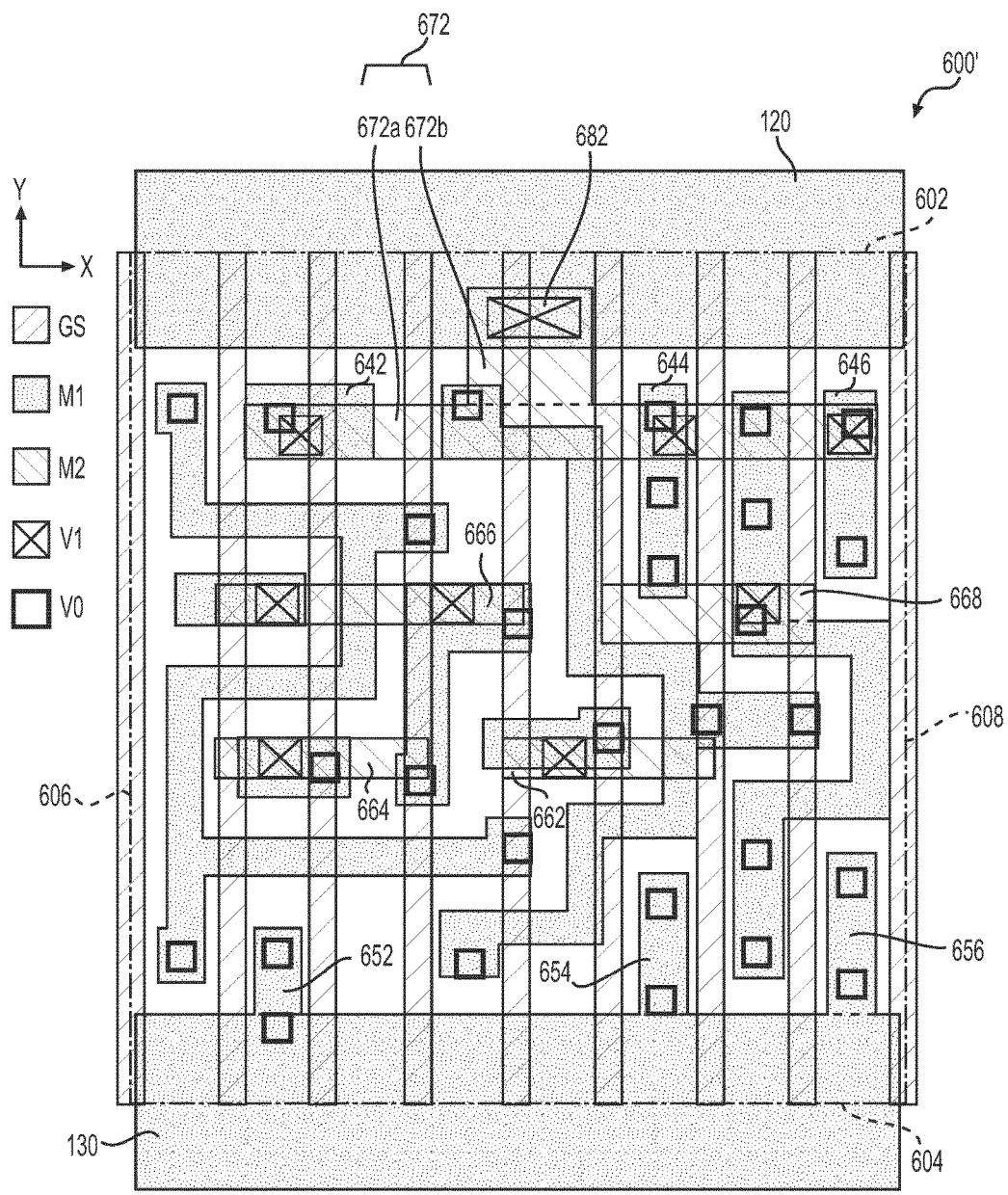
FIG. 6B shows a top view of another spare cell example 600' when the spare cell 600 is in an active mode, depicting the features thereof from the gate electrode layer and the via-zero layer up to the second conductive layer, according to an embodiment of the disclosure.

FIG. 6B shows a top view of a spare cell example 600' when the spare cell 600 is in an active mode, depicting the features thereof from the gate electrode layer GS and the via-zero layer V0 up to the second conductive layer M2, according to an embodiment of the disclosure. FIG. 6B is depicted in a layout diagram style, and not every features of the spare cell 600' is shown in FIG. 6B. The components in FIG. 6B that are the same or similar to those in FIG. 6A are given the same reference numbers, and detailed description thereof is thus omitted.

Compared with the spare cell 600 in FIG. 6A, the via-one layer V1 in FIG. 6B further includes a via 682 connecting the second portion 672*b* of conductive line 672 and the first power rail 120. Accordingly, the first power node 112 of the spare cell 600 becomes electrically coupled with the first power rail 120.

As depicted in FIG. 6A and FIG. 6B, the only difference between spare cell 600 (i.e., when the spare cell 600 is in the inactive mode) and spare cell 600' (i.e., when the spare cell 600 is in the active mode) is the features in the via-one layer V1. Therefore, when a circuit designer plans to activate the spare cell 600 in order to revise a circuit design of an integrated circuit based on an engineering change order, at the circuit cell level, only the layout patterns corresponding to manufacturing the via-one layer V1 is changed. The layout patterns corresponding to the active areas or the gate structures remain the same. As such, in this example, only the mask(s) corresponding to manufacturing the via-one layer V1 is replaced. Compared with the masks for manufacturing the active areas, the gate structures, or even the first and second conductive layers M1 and M2, in some embodiments, the mask(s) corresponding to manufacturing the via-one layer V1 is less expensive. Also, compared with changing the layout patterns of the active areas, the gate structures, or even the first and second conductive layers M1 and M2, in some embodiments, changing the layout patterns of the via-one layer V1 is less likely to cause a noticeable impact to the yield rate or the performance of the resulting integrated circuit.

Furthermore, for the spare cells 100 or 600, because a leakage path from the first power rail 120 through drain-source paths of various transistors of the logic component 110 to the second power rail 130 is electrically disconnected, the spare cell 100/600 has a greater leakage design margin in comparison with a counterpart spare cell that still has its first power node coupled with the first power rail. As such, in some embodiments, the transistors of the logic component 110 according to the present disclosure are formed of faster (and sometimes with higher leakage) transistors, such as low threshold voltage (LVT) or ultra-low threshold voltage (ULVT) transistors.

Figure 7:
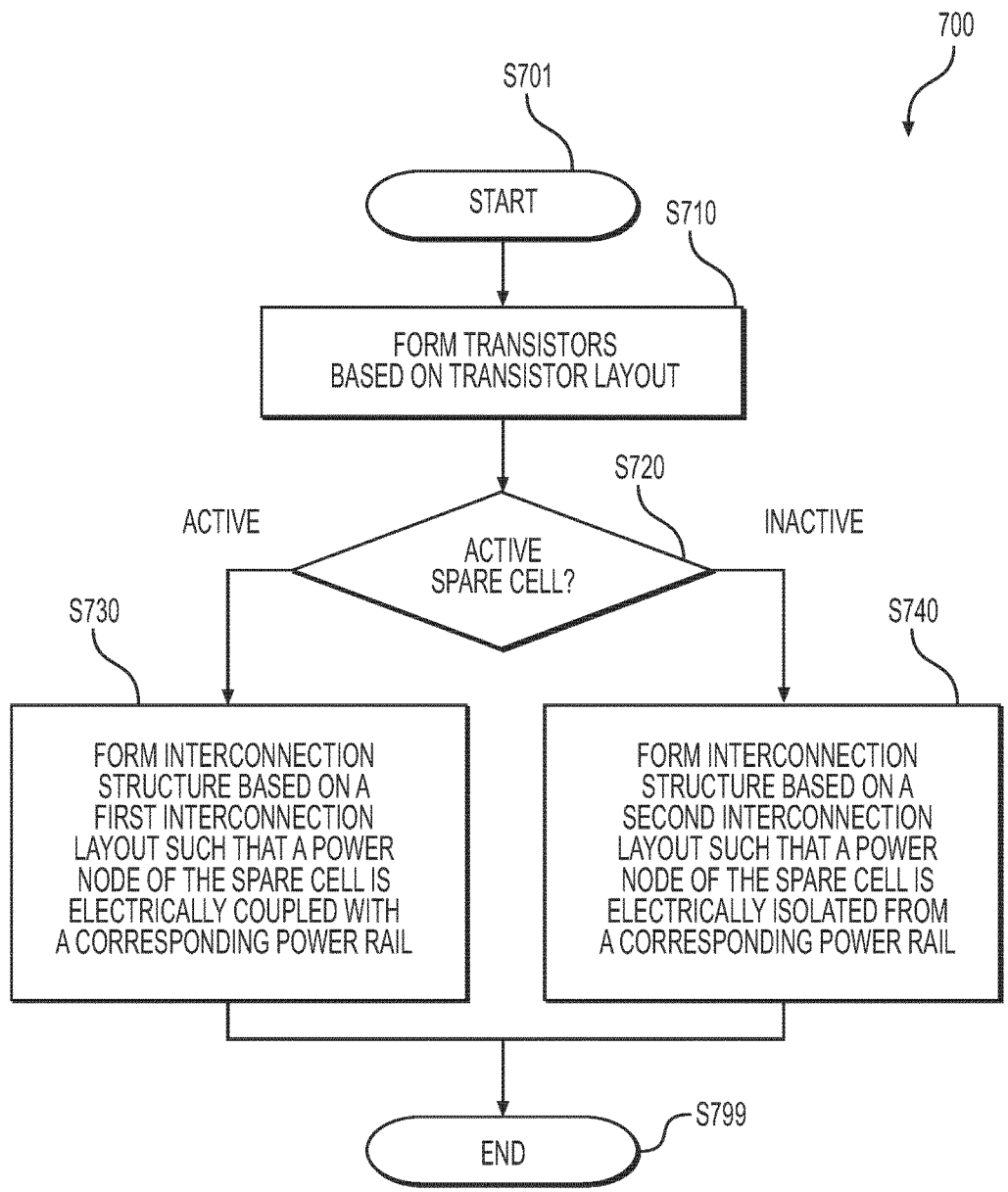
FIG. 7 shows a flow chart outlining a process example 700 of forming a spare cell, according to an embodiment of the disclosure.

FIG. 7 shows a flow chart outlining a process example 700 of forming a spare cell according to an embodiment of the disclosure. It is understood that additional operations may be performed before, during, and/or after the process 700 depicted in FIG. 7. The process 700 starts at S701 and proceeds to S710.

At S710, a plurality of transistors of a spare cell in an integrated circuit is formed on a substrate of the integrated circuit based on a set of layout patterns for forming the plurality of transistors. In some examples, forming a plurality of transistors for the spare cell 100 depicted in FIG. 3 includes forming active areas 312 and 314 and gates structures GS. In some embodiments, the set of layout patterns thus includes layout patterns for forming active areas and/or gate structures over the substrate.

In some embodiments, forming the plurality of transistors when the spare circuit cell is in the active mode and forming the plurality of transistors when the spare circuit cell is in the inactive mode are performed based on a same transistor layout configuration of the spare circuit cell.

At S720, it is determined whether the spare cell is to be configured in an active mode or in an inactive mode. If it is determined that the spare cell is to be configured in the active mode, the process proceeds to S730. If it is determined that the spare cell is to be configured in the inactive mode, the process proceeds to S740.

In some embodiments, when process 700 is performed in response to an engineering change order to manufacture a new version of an integrated circuit, S720 further includes revise the layout patterns corresponding to manufacturing the interconnection structure of the integrated circuit and fabricating new masks for forming the revised conductive and/or via layers for the new version integrated circuit. In at least one example, to activate an inactive spare cell, only the mask(s) corresponding to the second conductive layer M2 or the mask(s) corresponding to the via-one layer V1 are replaced with new mask(s).

At S730, an interconnection structure is formed based on a first interconnection layout design such that a power node of the spare cell is electrically coupled with a corresponding power rail. For example, as depicted in FIG. 3 and FIG. 4B, the plurality of transistors is electrically interconnected between a first power node 112 and a second power node 116 of the spare circuit cell 100. The second power node 116 is electrically coupled with the second power rail 130. When the spare cell 100 is in the active mode, the first power node 112 is electrically coupled with the first power rail 120. In some embodiments, forming the interconnection structure includes forming a first power rail 120 configured to carry a first supply voltage, forming a second power rail 130 configured to carry a second supply voltage, and forming a conductive structure.

In one example, the conductive structure includes conductive lines 452 and 454, and corresponding vias in the via-one layer V1 as depicted in FIG. 4B. Accordingly, forming the conductive structure includes forming conductive lines 446 and 448 in the second conductive layer M2, forming vias electrically coupling the conductive lines 446 and 448 and the first power rail 120, forming conductive lines 442 and 444 in the second conductive layer M2, forming vias electrically coupling the conductive lines 442 and 444 and the first power node, and when the spare cell is in the active mode, forming conductive lines that connects conductive lines 442 and 446 into conductive line 452 and forming conductive lines that connects conductive lines 444 and 448 into conductive line 454.

In another example, the conductive structure includes conductive line 672 and via 682 in the via-one layer V1 as depicted in FIG. 6B. Accordingly, forming the conductive structure includes forming conductive line 682 in the second conductive layer M2, forming vias electrically coupling the conductive line 672 and the first power node, and forming a via 682 electrically coupling the conductive line 672 and the first power rail 120.

At S740, an interconnection structure is formed based on a second interconnection layout design such that a power node of the spare cell is not electrically coupled with a corresponding power rail. For example, when the spare cell 100 is in the inactive mode, the first power node 112 is electrically isolated from the first power rail 120.

In some embodiments, forming the interconnection structure includes forming a first power rail 120 configured to carry a first supply voltage, forming a second power rail 130 configured to carry a second supply voltage, and forming a conductive structure. In one example, the conductive structure includes conductive lines 442, 444, 446, and 448, and corresponding vias in the via-one layer V1 as depicted in FIG. 4A. In another example, the conductive structure includes conductive line 672 as depicted in FIG. 6A and does not have the via 682 as depicted in FIG. 6B.

After S730 or S740, the process proceeds to S799 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit, comprising:
    a plurality of functional circuit cells, ones of the functional circuit cells respectively including:
    a set of first electrically interconnected transistors that define a first logic component, the set of first electrically interconnected transistors being interconnected through a first set of conductive lines formed in a first conductive layer of the integrated circuit; and
    a first power rail configured to carry a first supply voltage, the set of first electrically interconnected transistors being electrically coupled to the first power rail through an electrical interconnection formed in a second conductive layer of the integrated circuit; and
    a plurality of inactive spare functional circuit cells, ones of the inactive spare functional circuit cells respectively including:
    a set of second electrically interconnected transistors configured to define a second logic component, the set of second electrically interconnected transistors being interconnected through a second set of conductive lines formed in the first conductive layer, where the set of second electrically interconnected transistors is neither directly nor indirectly connected to any power rail.

2. The integrated circuit of claim 1, wherein the ones of the inactive spare functional circuit cells further respectively include:
    a second power rail configured to carry the first supply voltage, the set of second electrically interconnected transistors being electrically disconnected from the first power rail and the second power rail.

3. The integrated circuit of claim 1, further comprising:
    one or more active spare functional circuit cells, ones of the active spare functional circuit cells respectively including:
    a set of third electrically interconnected transistors configured to define a third logic component, the set of third electrically interconnected transistors being interconnected through a third set of conductive lines formed in the first conductive layer, wherein the respective active spare functional circuit cell had been provided as an inactive spare functional circuit in a previous version of the integrated circuit; and
    a second power rail, wherein the set of third electrically interconnected transistors is electrically coupled to the second power rail through an electrical interconnection formed in the second conductive layer of the integrated circuit.

4. The integrated circuit of claim 3, wherein a configuration of the set of second electrically interconnected transistors has the same configuration as the configuration of a corresponding set of third electrically interconnected transistors.

5. The integrated circuit of claim 3, wherein the first, second, and third logic components respectively are configured to provide the same logic functionality.

6. The integrated circuit of claim 3, wherein the first, second, and third logic components respectively are configured to provide different logic functionalities.

7. The integrated circuit of claim 1, wherein at least one of the inactive spare functional circuit cells includes:
    a second power rail disposed in the first conductive layer;
    a first conductive line in the second conductive layer and electrically coupled with the second power rail; and
    a second conductive line in the second conductive layer and electrically coupled with the corresponding set of second electrically interconnected transistors, the first conductive line and the second conductive line being aligned but separated from each other.

8. The integrated circuit of claim 1, wherein at least one of the inactive spare functional circuit cells includes:
    a second power rail disposed in the first conductive layer; and
    a conductive line in the second conductive layer electrically coupled with the corresponding set of second electrically interconnected transistors, a portion of the conductive line overlapping but electrically disconnected from the second power rail.

9. An integrated circuit, comprising:
    an interconnection structure, comprising:
    a first power rail configured to carry a first supply voltage;
    a second power rail configured to carry a second supply voltage different from the first supply voltage; and
    a conductive structure; and
    a plurality of transistors, the plurality of transistors being electrically interconnected between a first power node and a second power node of a spare circuit cell, the second power node being electrically coupled with the second power rail,
    the conductive structure configured to electrically couple the first power node and the first power rail when the spare circuit cell is in an active mode, and to not electrically coupled either directly or indirectly the first power node and any power rail when the spare circuit cell is in an inactive mode.

10. The integrated circuit of claim 9, wherein
    the first power rail is in a first conductive layer, and
    the conductive structure comprises:
    a first conductive line in a second conductive layer, the first conductive layer and the second conductive layer being in different layers;
    a first via electrically coupling the first conductive line and the first power rail;
    a second conductive line in the second conductive layer; and
    a second via electrically coupling the second conductive line and the first power node,
    wherein, when the spare circuit cell is in the active mode, the conductive structure further includes a third conductive line in the second conductive layer configured to physically connect the first conductive line and the second conductive line, and when the spare circuit cell is in the inactive mode, the conductive structure does not include the third conductive line, and the first conductive line and the second conductive line are electrically disconnected from each other.

11. The integrated circuit of claim 10, wherein
the first conductive layer is above the plurality of transistors; and
the second conductive layer is above the first conductive layer.

12. The integrated circuit of claim 9, wherein
the first power rail is in a first conductive layer, and
the conductive structure comprises:
a conductive line in a second conductive layer, the first conductive layer and the second conductive layer being arranged in different layers, the conductive line having a first portion and a second portion, with the second portion overlapping the first power rail; and
a first via that electrically couples the first portion of the conductive line and the first power node,
wherein, when the spare circuit cell is in the active mode, the conductive structure further includes a second via that electrically couples the second portion of the conductive line and the first power rail, and
when the spare circuit cell is in the inactive mode, the conductive structure does not include the second via.

13. The integrated circuit of claim 12, wherein
the first conductive layer is disposed above a layer in which the plurality of transistors are disposed; and
the second conductive layer is disposed above the first conductive layer.

14. The integrated circuit of claim 9, wherein a configuration of the plurality of transistors when the spare circuit cell is in the active mode is the same as a configuration of the plurality of transistors when the spare circuit cell is in the inactive mode.

15. The integrated circuit of claim 9, wherein the plurality of transistors are electrically interconnected as a logic component, comprising one or more of: a buffer, delay, or a logic gate including NAND, NOR, AND, OR, XOR, INV, AOI, or OAI.

16. A method of manufacturing an integrated circuit, comprising:
fabricating a plurality of transistors on an integrated circuit substrate; and
fabricating an interconnection structure over the plurality of transistors, a portion of the interconnection structure and the plurality of transistors being electrically interconnected as a spare circuit cell between a first power node and a second power node, forming the interconnection structure comprising:
fabricating a first power rail configured to carry a first supply voltage;
fabricating a second power rail configured to carry a second supply voltage different from the first supply voltage, the second power node being electrically coupled with the second power rail; and
fabricating a conductive structure electrically coupling the first power node and the first power rail when the spare circuit cell is in an active mode, and not electrically coupling either directly or indirectly the first power node and the first power rail when the spare circuit cell is in an inactive mode.

17. The method of claim 16, wherein
forming the first power rail comprises forming the first power rail in a first conductive layer; and
forming the conductive structure comprises:
forming a first conductive line in a second conductive layer, the first conductive layer and the second conductive layer being arranged in different layers;
forming a first via electrically coupling the first conductive line and the first power rail;
forming a second conductive line in the second conductive layer; and
forming a second via electrically coupling the second conductive line and the first power node,
wherein, when the spare circuit cell is in the active mode, forming the conductive structure further includes forming a third conductive line, the third conductive line physically connecting the first conductive line and the second conductive line, and
when the spare circuit cell is in the inactive mode, forming the conductive structure without forming the third conductive line, and the first conductive line and the second conductive line are separated from each other.

18. The method of claim 16, wherein
forming the first power rail comprises forming the first power rail in a first conductive layer; and
forming the conductive structure comprises:
forming a conductive line in a second conductive layer, the first conductive layer and the second conductive layer being arranged in different layers, the conductive line having a first portion and a second portion, with the second portion overlapping the first power rail; and
forming a first via that electrically couples the first portion of the conductive line and the first power node,
wherein, when the spare circuit cell is in the active mode, forming the conductive structure further includes forming a second via that electrically couples the second portion of the conductive line and the first power rail; and
when the spare circuit cell is in the inactive mode, forming the conductive structure does not include forming the second via.

19. The method of claim 16, wherein forming the interconnection structure further comprises:
forming a set of conductive lines to electrically connecting the plurality of transistors as a logic component, comprising a buffer, delay, or a logic gate including NAND, NOR, AND, OR, XOR, INV, AOI, or OAI.

20. The method of claim 16, wherein
forming the plurality of transistors is performed based on a transistor layout configuration of the spare circuit cell when the spare circuit cell is in the active mode; and
forming the plurality of transistors is performed based on the same transistor layout configuration of the spare circuit cell when the spare circuit cell is in the inactive mode.

* * * * *